US012790509B2

(12) United States Patent
Kim et al.

(10) Patent No.: US 12,790,509 B2
(45) Date of Patent: Nov. 10, 2026

(54) HARDMASK COMPOSITION, HARDMASK LAYER AND METHOD OF FORMING PATTERNS

(71) Applicant: SAMSUNG SDI CO., LTD., Yongin-si (KR)

(72) Inventors: Sunghwan Kim, Suwon-si (KR); Yushin Park, Suwon-si (KR); Sunyoung Yang, Suwon-si (KR); Yongsik Yoo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 969 days.

(21) Appl. No.: 17/696,011

(22) Filed: Mar. 16, 2022

(65) Prior Publication Data

US 2022/0315790 A1 Oct. 6, 2022

(30) Foreign Application Priority Data

Apr. 5, 2021 (KR) ........................ 10-2021-0044144

(51) Int. Cl.
*C09D 161/02* (2006.01)
*C08G 6/00* (2006.01)
*G03F 7/11* (2006.01)

(52) U.S. Cl.
CPC ............. *C09D 161/02* (2013.01); *C08G 6/00* (2013.01); *G03F 7/11* (2013.01)

(58) Field of Classification Search
CPC ............ G03F 7/11; C08G 6/00; C09D 161/02
See application file for complete search history.

(56) References Cited

U.S. PATENT DOCUMENTS

| | | | | |
|---|---|---|---|---|
| 2011/0275019 | A1 | 11/2011 | Yoon et al. | |
| 2015/0166711 | A1* | 6/2015 | Cui | C08G 8/04 528/137 |
| 2017/0073453 | A1 | 3/2017 | Cui et al. | |
| 2019/0212649 | A1* | 7/2019 | Saito | G03F 7/094 |
| 2020/0017678 | A1* | 1/2020 | Lim | H01L 21/0271 |

(Continued)

FOREIGN PATENT DOCUMENTS

| | | | |
|---|---|---|---|
| CN | 104710588 | A | 6/2015 |
| CN | 108628102 | A | 10/2018 |
| CN | 111383912 | A | 7/2020 |

(Continued)

OTHER PUBLICATIONS

KR 101910450 English Translation (Year: 2025).*

(Continued)

*Primary Examiner* — Jonathan Johnson
*Assistant Examiner* — Jayson D Cosgrove
(74) *Attorney, Agent, or Firm* — Lee IP Law, P.C.

(57) ABSTRACT

A hardmask composition, a hardmask layer, and a method of forming patterns, the hardmask composition including a polymer and a solvent, wherein the polymer includes a structural unit represented by Chemical Formula 1:

[Chemical Formula 1]

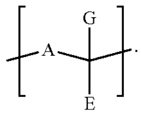

5 Claims, 1 Drawing Sheet

(56) References Cited

U.S. PATENT DOCUMENTS

| | | | |
|---|---|---|---|
| 2020/0209754 | A1 | 7/2020 | Kim et al. |

FOREIGN PATENT DOCUMENTS

| | | | | | |
|---|---|---|---|---|---|
| JP | 2011-107684 | A | | 6/2011 | |
| JP | 5257009 | B2 | | 8/2013 | |
| JP | 2017-125182 | A | | 7/2017 | |
| JP | 2018-63424 | A | | 4/2018 | |
| JP | 2020-12110 | A | | 1/2020 | |
| JP | 2020-106840 | A | | 7/2020 | |
| KR | 10-0671115 | B1 | | 1/2007 | |
| KR | 10-0908601 | B1 | | 7/2009 | |
| KR | 20100080139 | A | * | 7/2010 | ........... G03F 7/0045 |
| KR | 10-2012-0077466 | A | | 7/2012 | |
| KR | 10-2015-0069557 | A | | 6/2015 | |
| KR | 10-2016-0099997 | A | | 8/2016 | |
| KR | 10-1812764 | B1 | | 12/2017 | |
| KR | 101910450 | B1 | * | 1/2019 | ............. G03F 7/004 |
| KR | 10-2019-0113368 | A | | 10/2019 | |
| KR | 10-2021-0121870 | A | | 10/2021 | |
| WO | WO 2018/131562 | A1 | | 7/2018 | |
| WO | WO 2019/190065 | A1 | | 10/2019 | |

OTHER PUBLICATIONS

KR 20100080139 English Translation (Year: 2025).*

Chinese Office Action (including a search report) dated May 29, 2024, of the corresponding Chinese Patent Application No. 202210290756.9.

Taiwanese Search Report of the corresponding Taiwanese Patent Application No. 111110713 dated Mar. 29, 2023.

* cited by examiner

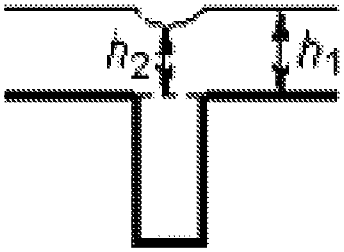
h2
h1

HARDMASK COMPOSITION, HARDMASK LAYER AND METHOD OF FORMING PATTERNS

CROSS-REFERENCE TO RELATED APPLICATION

This application claims priority to and the benefit of Korean Patent Application No. 10-2021-0044144 filed in the Korean Intellectual Property Office on Apr. 5, 2021, the entire contents of which are incorporated herein by reference.

BACKGROUND

1. Field

Embodiments relate to a hardmask composition, a hardmask layer, and a method of forming patterns.

2. Description of the Related Art

Recently, the semiconductor industry has developed to an ultra-fine technique having a pattern of several to several tens of nanometer size. Such ultrafine technique utilize effective lithographic techniques.

Some lithographic techniques include providing a material layer on a semiconductor substrate; coating a photoresist layer thereon; exposing and developing the same to provide a photoresist pattern; and etching a material layer using the photoresist pattern as a mask.

SUMMARY

The embodiments may be realized by providing a hardmask composition including a polymer; and a solvent, wherein the polymer includes a structural unit represented by Chemical Formula 1:

[Chemical Formula 1]

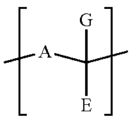

in Chemical Formula 1, A is a hydroxy methoxy pyrene moiety, E is a substituted or unsubstituted pyrenyl group, and G is hydrogen, deuterium, a substituted or unsubstituted C1 to C30 alkyl group, a substituted or unsubstituted C6 to C30 aryl group, a halogen, a nitro group, an amino group, a hydroxyl group, or a combination thereof.

A may include a moiety of Group 1:

[Group 1]

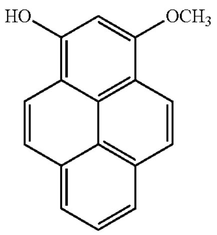

-continued

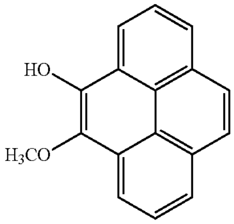

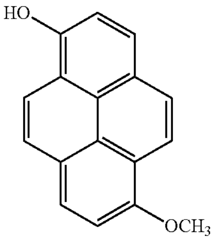

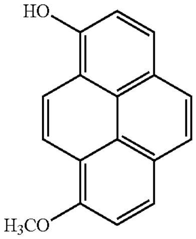

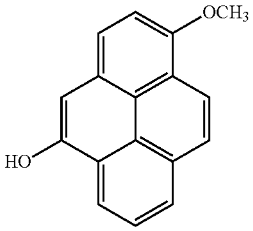

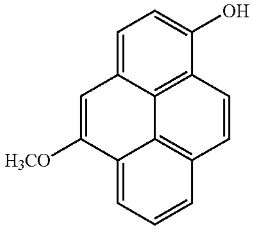

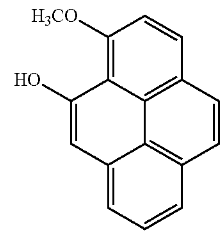

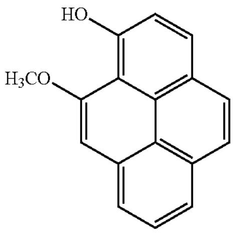

-continued

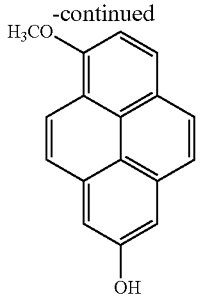

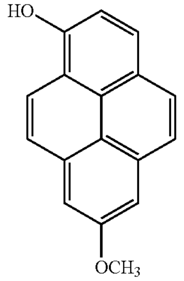

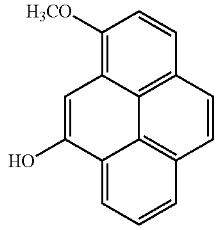

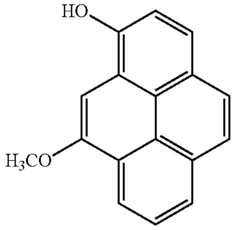

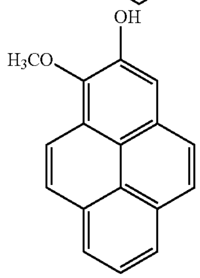

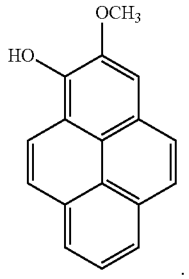

E may be an unsubstituted pyrenyl group or a pyrenyl group substituted with at least one substituent, and the at least one substituent is deuterium, a halogen, a nitro group, an amino group, a hydroxyl group, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

The at least one substituent may be a nitro group, a hydroxyl group, a substituted or unsubstituted methoxy group, a substituted or unsubstituted ethoxy group, a substituted or unsubstituted propoxy group, a substituted or unsubstituted butoxy group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted propenyl group, a substituted or unsubstituted butenyl group, a substituted or unsubstituted ethynyl group, a substituted or unsubstituted propynyl group, a substituted or unsubstituted butynyl group, or a combination thereof.

E may be a pyrenyl group, a 1-hydroxy pyrenyl group, a 1-methoxy pyrenyl group, a 1-hydroxy-6-methoxy pyrenyl group, a 1,6-dihydroxy pyrenyl group, a 1,6-dimethoxy pyrenyl group, a 1-nitro pyrenyl group, or a combination thereof.

The structural unit represented by Chemical Formula 1 may be represented by one of Chemical Formulae 2 to 5:

[Chemical Formula 2]

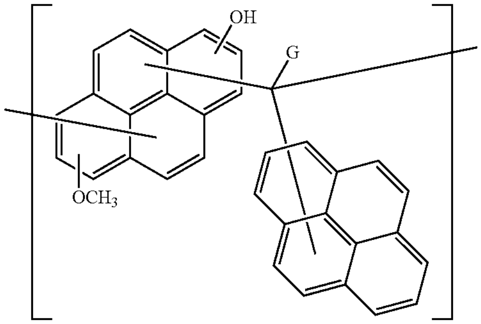

[Chemical Formula 3]

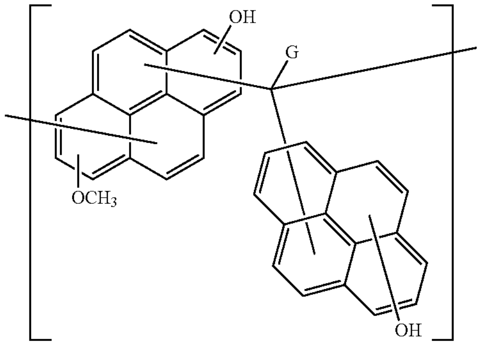

-continued

[Chemical Formula 4]

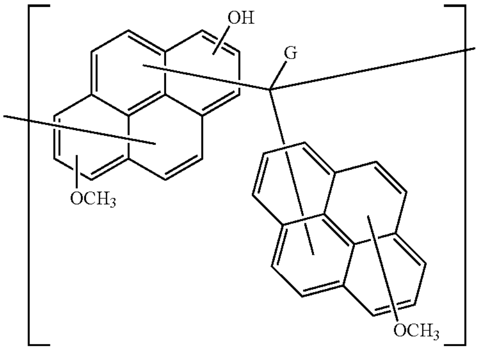

[Chemical Formula 5]

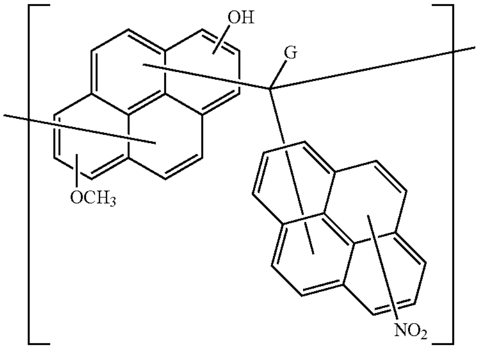

in Chemical Formulae 2 to 5, G may be hydrogen, deuterium, a substituted or unsubstituted C1 to C30 alkyl group, a substituted or unsubstituted C6 to C30 aryl group, a halogen, a nitro group, an amino group, a hydroxyl group, or a combination thereof.

The structural unit represented by Chemical Formula 1 may be derived from a reaction mixture including a hydroxy methoxy pyrene compound, and a substituted or unsubstituted pyrene carbonyl compound.

The hydroxy methoxy pyrene compound may be a compound of Group 2:

[Group 2]

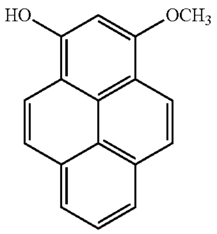

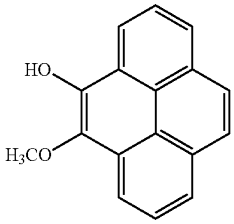

-continued

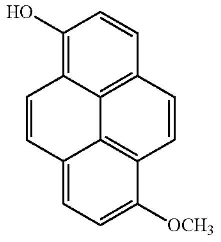

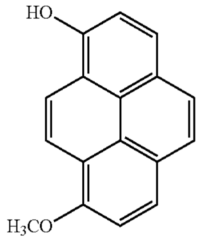

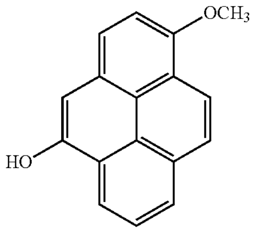

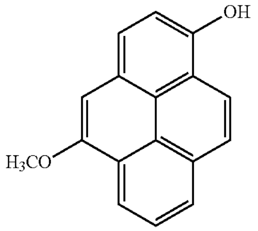

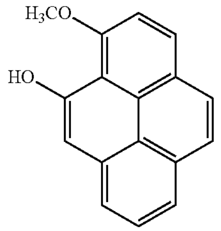

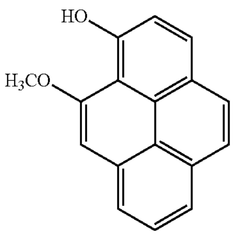

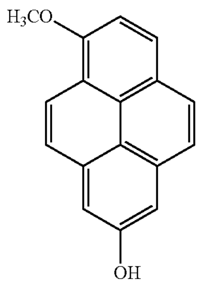

-continued

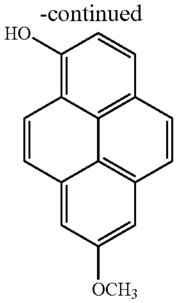

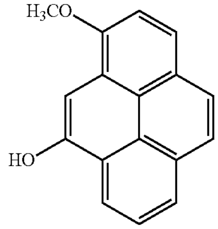

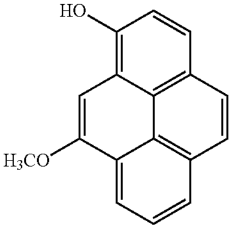

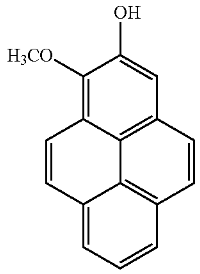

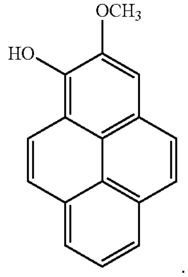

The substituted or unsubstituted pyrene carbonyl compound may be pyrene carboxaldehyde, hydroxypyrene carboxaldehyde, methoxy pyrene carboxaldehyde, hydroxy methoxy pyrene carboxaldehyde, dihydroxy pyrene carboxaldehyde, dimethoxy pyrene carboxaldehyde, nitropyrene carboxaldehyde, acetylpyrene, acetylhydroxypyrene, acetylmethoxy pyrene, acetylhydroxy methoxy pyrene, or a combination thereof.

The embodiments may be realized by providing a hardmask layer comprising a cured product of the hardmask composition according to an embodiment.

The cured product may include a condensed polycyclic aromatic hydrocarbon.

The embodiments may be realized by providing a method of forming patterns, the method including applying the hardmask composition according to an embodiment on a material layer and heat-treating the resultant to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed part of the material layer.

BRIEF DESCRIPTION OF THE DRAWING

Features will be apparent to those of skill in the art by describing in detail exemplary embodiments with reference to the attached drawings in which:

The FIGURE is a reference diagram exemplarily showing a step difference of a hardmask layer in order to explain a method for evaluating planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, when a definition is not otherwise provided, "substituted" refers to replacement of a hydrogen atom of a compound by a substituent selected from deuterium, a halogen atom (F, Br, Cl, or I), a hydroxyl group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, two adjacent substituents of the substituted halogen atom (F, Br, Cl, or I), hydroxyl group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C20 heteroalkyl group, C3 to C20 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms selected from N, O, S, Se, and P.

As used herein, "aryl group" refers to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

More specifically, the substituted or unsubstituted aryl group may be a substituted or unsubstituted phenyl group, a substituted or unsubstituted naphthyl group, a substituted or unsubstituted anthracenyl group, a substituted or unsubstituted phenanthryl group, a substituted or unsubstituted fluorenyl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a combination thereof, or a combined fused ring of the foregoing groups, but is not limited thereto.

More specifically, the substituted or unsubstituted heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiphenyl group, a substituted or unsubstituted carbazolyl group, a substituted or unsubstituted pyridoindolyl group, a substituted or unsubstituted benzopyridooxazinyl group, a substituted or unsubstituted benzopyridothiazinyl group, a substituted or unsubstituted 9,9-dimethyl-9,10-dihydroacridinyl group, a combination thereof, or a combined fused ring of the foregoing groups, but is not limited thereto. In one example of the present invention, the heterocyclic group or the heteroaryl group may be a pyrrole group, an indolyl group, or a carbazolyl group.

As used herein, "arylene group" means that there are two linking groups in the substituted or unsubstituted aryl group as defined above, and may be for example a substituted or unsubstituted phenylene group, a substituted or unsubstituted naphthalene group, a substituted or unsubstituted anthracenylene group, a substituted or unsubstituted phenanthrylene group, a substituted or unsubstituted naphthacenylene group, a substituted or unsubstituted A substituted or unsubstituted biphenylene group, a substituted or unsubstituted biphenylene group, a substituted or unsubstituted terphenylene group, a substituted or unsubstituted quaterphenylene group, a substituted or unsubstituted chrysenylene group, a substituted or unsubstituted triphenylenylene group, a substituted or unsubstituted perylenylene group, a substituted or unsubstituted indenylene group, a combination thereof, or a condensed form of a combination thereof, but is not limited thereto.

As used herein, the polymer may include an oligomer or a polymer.

Hereinafter, a hardmask composition according to an embodiment is described.

The hardmask composition according to an embodiment may include a polymer and a solvent.

The polymer may include a main chain including an aromatic ring substituted with a (e.g., one) hydroxyl group and a (e.g., one) methoxy group, and a side chain including an aromatic ring bonded to the main chain.

The main chain including the aromatic ring substituted with a hydroxyl group and a methoxy group may include a condensed aromatic ring substituted with a hydroxyl group and a methoxy group, e.g., a hydroxymethoxy pyrene moiety. The side chain including the aromatic ring may include a condensed aromatic ring, e.g., a pyrene moiety.

Due to the aromatic rings in both the main chain and the side chain, a hard polymer layer may be formed, thereby improving the etch resistance. In addition, by including an aromatic ring substituted with one hydroxyl group and one methoxy group in the main chain, solubility in solvents increases to be effectively applied to solution processes such as spin coating, and a polymer layer with improved film density may be formed.

In an implementation, the polymer may include, e.g., a structural unit represented by Chemical Formula 1.

[Chemical Formula 1]

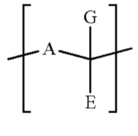

In Chemical Formula 1, A may be, e.g., a hydroxy methoxy pyrene moiety.

E may be or may include, e.g., a substituted or unsubstituted pyrenyl group.

G may be or may include, e.g., hydrogen, deuterium, a substituted or unsubstituted C1 to C30 alkyl group, a substituted or unsubstituted C6 to C30 aryl group, a halogen, a nitro group, an amino group, a hydroxyl group, or a combination thereof.

In the Chemical Formulae herein, "—" represents a bonding location to an adjacent atom.

In an implementation, in A, the hydroxyl group and the methoxy group of the hydroxy methoxy pyrene moiety may be present on the same rings of the pyrene moiety, or may be present on different rings of the pyrene moiety. In an implementation, each of the rings facing each other in the pyrene moiety may be substituted, or each of the rings adjacent to each other in the pyrene moiety may be substituted.

In an implementation, the polymer may include a pyrene moiety having one hydroxyl group and one methoxy group in a main chain, and thus may form a polymer layer having much higher etch resistance to $CF_x$ etching gas or $N_2/O_2$ mixed gas than a polymer including a pyrene moiety substituted with two or more hydroxyl groups alone (e.g., without a methoxy group) in the main chain. In addition, the polymer according to an embodiment may form a polymer layer having excellent film density, compared with a polymer including a pyrene moiety substituted with two or more methoxy groups alone (e.g., without a hydroxy group) in the main chain.

In an implementation, A may be, e.g., a moiety of Group 1.

[Group 1]

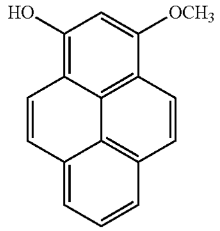

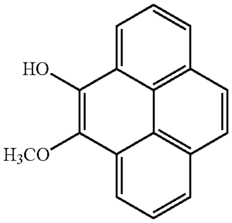

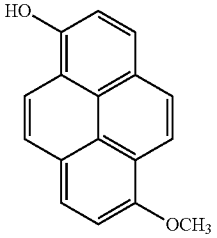

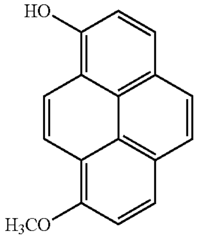

-continued

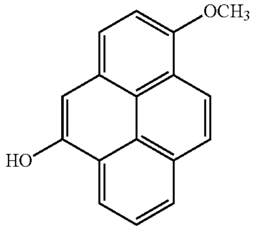

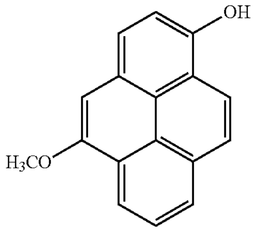

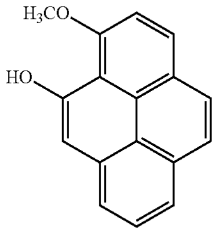

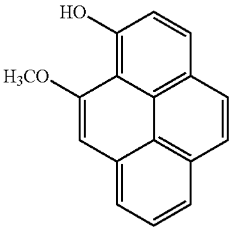

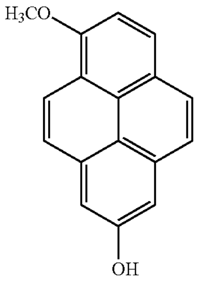

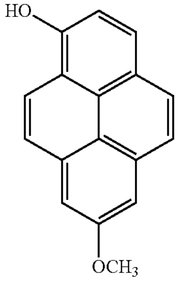

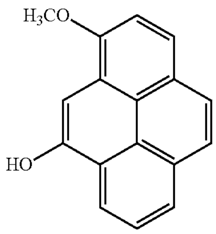

-continued

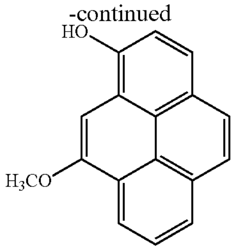

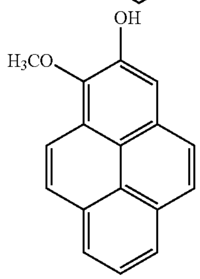

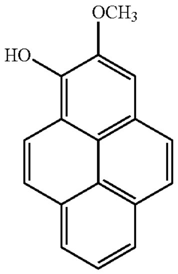

The polymer may include, e.g., the aforementioned hydroxymethoxy pyrene moiety (A) in the main chain and a substituted or unsubstituted pyrenyl group (E) in the side chain, and thus may secure a sufficient a carbon content so as to form a hard polymer layer, and the polymer layer may have a high etch resistance, and thus may help reduce or prevent damages by etching gases during the subsequent etching process. In an implementation, when a composition including the polymer is formed into a film, when there is a step difference on a lower substrate (or film) or a pattern is formed, excellent gap-fill and planarization characteristics may be provided.

In an implementation, E may be, e.g., an unsubstituted pyrenyl group or a pyrenyl group substituted with a substituent. In an implementation, the pyrenyl group may be substituted with a plurality of substituents, and each substituent may be the same as or different from each other.

In an implementation, each substituent may independently be, e.g., deuterium, a halogen, a nitro group, an amino group, a hydroxyl group, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

In an implementation, each substituent may independently be, e.g., a nitro group, a hydroxyl group, a substituted or unsubstituted methoxy group, a substituted or unsubstituted ethoxy group, a substituted or unsubstituted propoxy group, a substituted or unsubstituted butoxy group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted propenyl group, a substituted or unsubstituted butenyl group, a substituted or unsubstituted ethynyl group, a substituted or unsubstituted propynyl group, a substituted or unsubstituted butynyl group, or a combination thereof.

In an implementation, in E, the substituents may all be present on the same ring of the pyrene moiety, or may be present on different rings of the pyrene moiety. In an implementation, each of the rings facing each other in the pyrene may be substituted, or each of the rings adjacent to each other in the pyrene may be substituted. In an implementation, the substituents are the same as described above.

In an implementation, when E is a pyrenyl group substituted with two substituents, both substituents may be present on the same ring of the pyrene moiety, or may be present on different rings of the pyrene moiety. In an implementation, each of the rings facing each other in the pyrene moiety may be substituted in a ring, or each of the rings adjacent to each other in the pyrene moiety may be substituted. In an implementation, the substituents are the same as described above.

In an implementation, E may be, e.g., an unsubstituted pyrenyl group, a pyrenyl group substituted with one substituent, or a pyrenyl group substituted with two substituents. When E is a pyrenyl group substituted with two substituents, the two substituents may be the same as or different from each other, and the two substituents may be separate or may be linked to each other to form a ring. In an implementation, the substituents may be the same as described above.

In an implementation, E may be, e.g., an unsubstituted pyrenyl group, a pyrenyl group substituted with a nitro group, a pyrenyl group substituted with a hydroxyl group, a pyrenyl group substituted with a substituted or unsubstituted C1 to C30 alkyl group, a pyrenyl group substituted with a hydroxyl group and a substituted or unsubstituted C1 to C30 alkoxy group, or a combination thereof. In an implementation, the substituted or unsubstituted C1 to C30 alkoxy group may be a substituted or unsubstituted methoxy group, a substituted or unsubstituted ethoxy group, a substituted or unsubstituted propoxy group, a substituted or unsubstituted butoxy group, or a combination thereof.

In an implementation, E may be, e.g., an unsubstituted pyrenyl group, a hydroxy pyrenyl group, a methoxy pyrenyl group, a hydroxymethoxy pyrenyl group, a dihydroxy pyrenyl group, a dimethoxy pyrenyl group, a nitro pyrenyl group, or a combination thereof.

In an implementation, E may be, e.g., an unsubstituted pyrenyl group, a 1-hydroxy pyrenyl group, a 1-methoxy pyrenyl group, a 1-hydroxy-6-methoxy pyrenyl group, a 1,6-dihydroxy pyrenyl group, a 1,6-dimethoxy pyrenyl group, a 1-nitro pyrenyl group, or a combination thereof.

In an implementation, G may be, e.g., hydrogen, deuterium, a halogen, a nitro group, an amino group, a hydroxyl group, or a combination thereof. In an implementation, G may be hydrogen.

When G is hydrogen, the side chain (E) including the substituted or unsubstituted pyrenyl group may be bonded to the main chain by or at a tertiary carbon. The polymer may exhibit further increased solubility in solvents due to the tertiary carbon, so that it may be effectively applied to a solution process such as spin coating, and may also increase a carbon content to form a hard polymer layer, thereby imparting higher etch resistance and providing a polymer layer having excellent film density.

In an implementation, the structural unit represented by Chemical Formula 1 may be represented by, e.g., one of Chemical Formulae 2 to 5.

[Chemical Formula 2]

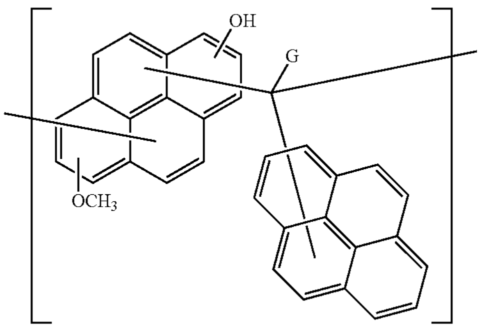

[Chemical Formula 3]

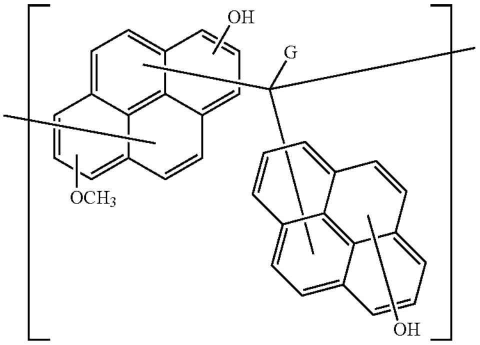

[Chemical Formula 4]

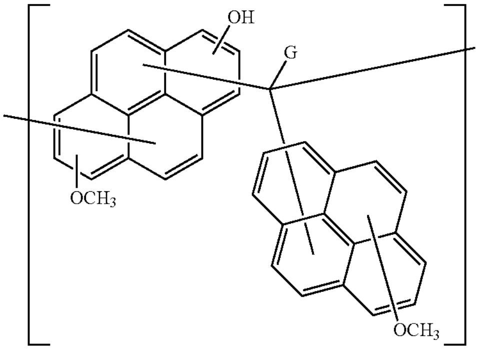

[Chemical Formula 5]

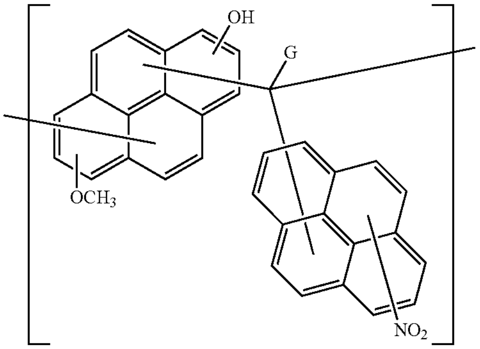

In Chemical Formulae 2 to 5, G may be the same as described above with respect to Chemical Formula 1.

In an implementation, the structural unit represented by Chemical Formula 1 may be derived from a reaction mixture including hydroxy methoxy pyrene and a substituted or unsubstituted pyrene carbonyl compound.

In an implementation, the structural unit may be obtained through a condensation reaction of the reaction mixture.

Both the hydroxy group and the methoxy group of the hydroxyl methoxy pyrene may be present on the same rings of the pyrene moiety, or may be present on different rings of the pyrene moiety. In an implementation, each of the rings facing each other in the pyrene may be substituted, or each of the rings adjacent to each other in the pyrene may be substituted.

In an implementation, the hydroxyl methoxy pyrene may be a moiety of the following Group 2.

[Group 2]

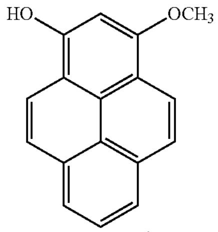

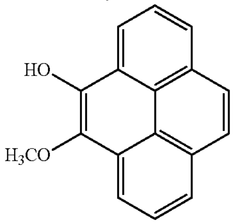

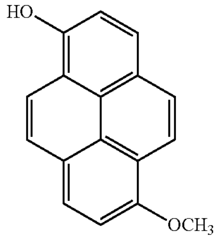

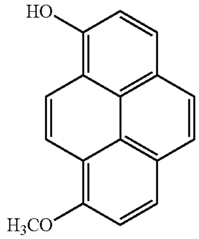

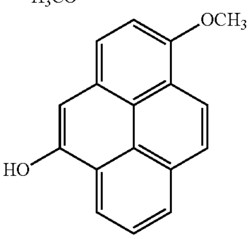

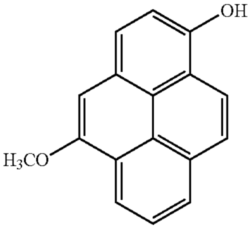

-continued

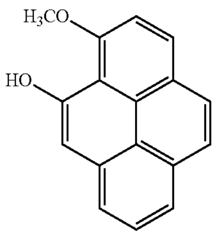

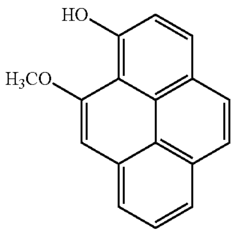

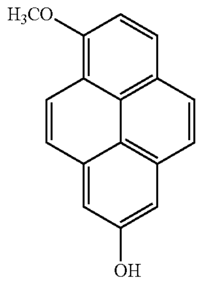

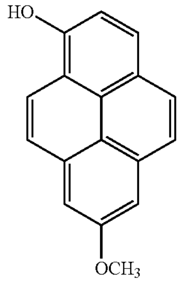

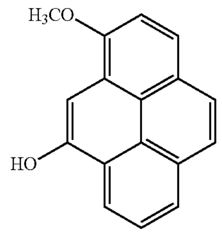

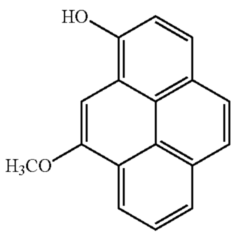

-continued

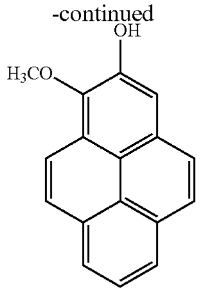

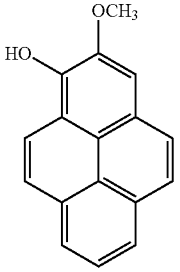

In an implementation, the substituted or unsubstituted pyrene carbonyl compound may be an unsubstituted pyrene carboxyl aldehyde, may be substituted with at least one substituent that is the same as or different from each other, it may be unsubstituted acetylpyrene, or may be substituted with at least one substituent that is the same as or different from each other.

In an implementation, each substituent may independently be, e.g., deuterium, a halogen, a nitro group, an amino group, a hydroxyl group, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

In an implementation, each substituent may independently be, e.g., a nitro group, a hydroxyl group, a substituted or unsubstituted methoxy group, a substituted or unsubstituted ethoxy group, a substituted or unsubstituted propoxy group, a substituted or unsubstituted butoxy group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted propenyl group, a substituted or unsubstituted butenyl group, a substituted or unsubstituted ethynyl group, a substituted or unsubstituted propynyl group, a substituted or unsubstituted butynyl group, or a combination thereof.

In an implementation, in the substituted or unsubstituted pyrene carbonyl compound, substituents may be present on the same ring of the pyrene moiety, or may be present on different rings of the pyrene moiety. In an implementation, each of the rings facing each other in the pyrene moiety may be substituted, or each of the rings adjacent to each other in the pyrene moiety may be substituted. In an implementation, the substituents are the same as described above.

In an implementation, when E is a pyrene carbonyl compound substituted with two substituents, both substituents may be present on the same ring of the pyrene moiety, or may be present on different rings of the pyrene moiety. In an implementation, each of the rings facing each other in the pyrene may be substituted, or each of the rings adjacent to each other in the pyrene may be substituted. In an implementation, the substituents are the same as described above.

In an implementation, the substituted or unsubstituted pyrene carbonyl compound may include, e.g., unsubstituted pyrene carboxaldehyde, pyrene carboxaldehyde substituted with one substituent, pyrene carboxaldehyde substituted with two substituents, unsubstituted acetylpyrene, acetylpyrene substituted with one substituent, or acetylpyrene substituted with two substituents. In the case of pyrene or acetylpyrene substituted with two substituents, the two substituents may be the same as or different from each other, and the two substituents may be separate or may be linked to each other to form a ring. In an implementation, the substituents are the same as described above.

In an implementation, the substituted or unsubstituted pyrene carbonyl compound may be, e.g., unsubstituted pyrene carboxaldehyde, pyrene carboxaldehyde substituted with a hydroxyl group, pyrene carboxaldehyde substituted with a substituted or unsubstituted C1 to C30 alkoxy group, pyrene carboxaldehyde substituted with a hydroxyl group and a substituted or unsubstituted C1 to C30 alkoxy group, unsubstituted acetylpyrene, acetylpyrene substituted with a hydroxyl group, acetylpyrene substituted with a substituted or unsubstituted C1 to C30 alkoxy group, or acetylpyrene substituted with a hydroxyl group and a substituted or unsubstituted C1 to C30 alkoxy group. In an implementation, the substituted or unsubstituted C1 to C30 alkoxy group may be, e.g., a substituted or unsubstituted methoxy group, a substituted or unsubstituted ethoxy group, a substituted or unsubstituted propoxy group, a substituted or unsubstituted butoxy group, or a combination thereof.

In an implementation, the substituted or unsubstituted pyrene carbonyl compound may be, e.g., pyrene carboxaldehyde, hydroxypyrene carboxaldehyde, methoxy pyrene carboxaldehyde, hydroxy methoxy pyrene carboxaldehyde, dihydroxy pyrene carboxaldehyde, dimethoxy pyrene carboxaldehyde, nitropyrene carboxaldehyde, acetylpyrene, acetylhydroxypyrene, acetylmethoxy pyrene, acetylhydroxy methoxy pyrene, or a combination thereof.

In an implementation, the polymer may include one or a plurality of structural units represented by Chemical Formula 1, and may include a plurality of repeating units. When the aforementioned structural unit represented by the Chemical Formula 1 exists as a plurality of repeating units, the number and arrangement of the repeating units may be a suitable number and arrangement.

The polymer may have a weight average molecular weight of, e.g., about 500 to about 200,000. In an implementation, the polymer may have a weight average molecular weight of, e.g., about 1,000 to about 100,000, about 1,200 to about 50,000, or about 1,200 to about 10,000. When the polymer has a weight average molecular weight within the ranges, the polymer may be optimized by adjusting the amount of carbon and solubility in a solvent.

In an implementation, the solvent used in the hardmask composition may be a suitable solvent having sufficient dissolubility or dispersibility with respect to the polymer. In an implementation, the solvent may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate (PGMEA), cyclohexanone (ANONE), ethyl lactate, gamma-butyrolactone, N,N-dimethyl formamide, N,N-dimethyl acetamide, methyl pyrrolidone, methyl pyrrolidinone, acetylacetone, or ethyl 3-ethoxypropionate.

In an implementation, the polymer may be included in an amount of, e.g., about 0.1 wt % to about 50 wt %, about 0.5 wt % to about 40 wt %, about 1 wt % to about 30 wt %, or about 2 wt % to about 20 wt %, based on a total weight of the hardmask composition. When the polymer is included within the ranges, a thickness, surface roughness and planarization of the hardmask may be controlled.

In an implementation, the hardmask composition may further include an additive, e.g., a surfactant, a crosslinking agent, a thermal acid generator, or a plasticizer.

In an implementation, the surfactant may include, e.g., a fluoroalkyl compound, an alkylbenzene sulfonate salt, an alkyl pyridinium salt, polyethylene glycol, or a quaternary ammonium salt.

In an implementation, the crosslinking agent may include, e.g., a melamine crosslinking agent, a substituted urea crosslinking agent, or a polymer crosslinking agent. In an implementation, it may be a crosslinking agent having at least two crosslinking forming substituents, e.g., methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, butoxymethylated thiourea, or the like.

The crosslinking agent may be a crosslinking agent having high heat resistance. The crosslinking agent having high heat resistance may be a compound including a crosslinking substituent including an aromatic ring (e.g., a benzene ring or a naphthalene ring) in the molecule.

In an implementation, the thermal acid generator may include, e.g., an acidic compound such as p-toluene sulfonic acid, trifluoromethane sulfonic acid, pyridiniump-toluenesulfonic acid, salicylic acid, sulfosalicylic acid, citric acid, benzoic acid, hydroxybenzoic acid, naphthalenecarbonic acid, or the like, 2,4,4,6-tetrabromocyclohexadienone, benzointosylate, 2-nitrobenzyltosylate, other organosulfonic acid alkylester, or the like.

The additive may be included in an amount of, e.g., about 0.001 to 40 parts by weight, about 0.01 to 30 parts by weight, or about 0.1 to 20 parts by weight, based on 100 parts by weight of the hardmask composition. Within the ranges, solubility may be improved while optical properties of the hardmask composition are not changed.

According to another embodiment, an organic film may be produced using the hardmask composition. The organic film may be, e.g., formed by coating the hardmask composition on a substrate and heat-treating it for curing and may include, e.g., a hardmask layer, a planarization layer, a sacrificial layer, a filler, or the like, for an electronic device.

According to another embodiment, a hardmask layer may include a cured product of the aforementioned hardmask composition.

In an implementation, the cured product may include a condensed polycyclic aromatic hydrocarbon.

In an implementation, the condensed polycyclic aromatic hydrocarbon may include, e.g., a substituted or unsubstituted naphthalene, a substituted or unsubstituted anthracene, a substituted or unsubstituted phenanthrene, a substituted or unsubstituted naphthacene, a substituted or unsubstituted pyrene, a substituted or unsubstituted chrysene, substituted or unsubstituted triphenylene, substituted or unsubstituted perylene, a combination thereof, or a combined fused ring of the foregoing groups.

In an implementation, the cured product may further include a heterocycle.

In an implementation, the cured product may include the condensed polycyclic aromatic hydrocarbon, and it may exhibit high etch resistance to withstand etching gases and chemical liquids exposed in subsequent processes including etching processes.

Hereinafter, a method of forming patterns using the aforementioned hardmask composition is described.

A method of forming patterns according to an embodiment may include, e.g., forming a material layer on a substrate, applying a hardmask composition including the aforementioned polymer and solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching the exposed portion of the material layer.

The substrate may be, e.g., a silicon wafer, a glass substrate, or a polymer substrate.

The material layer is a material to be finally patterned, e.g., a metal layer such as an aluminum layer and a copper layer, a semiconductor layer such as a silicon layer, or an insulation layer such as a silicon oxide layer or a silicon nitride layer. The material layer may be formed through, e.g., a chemical vapor deposition (CVD) process.

The hardmask composition may be the same as described above, and may be applied by spin-on coating in a form of a solution. In an implementation, a thickness of the hardmask composition may be, e.g., about 50 Å to about 200,000 Å.

The heat-treating of the hardmask composition may be performed, e.g., at about 100° C. to about 700° C. for about 10 seconds to about 1 hour.

In an implementation, the method may further include forming a silicon-containing thin layer on the hardmask layer. The silicon-containing thin layer may be formed of a material, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface hardmask layer before forming the photoresist layer.

Exposure of the photoresist layer may be performed using, e.g., ArF, KrF, or EUV. After exposure, heat-treating may be performed at, e.g., about 100° C. to about 700° C.

The etching process of the exposed portion of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of patterns, and the plurality of patterns may include a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Intermediates

Synthesis Example 1a 6-methoxy-1-pyrene carboxaldehyde (26.0 g, 0.1 mol) and m-chloroperbenzoic acid (34.5 g, 0.2 mol) were dissolved in 250 mL of dichloromethane in a flask and then, stirred at 40° C. for 12 hours. When a reaction was completed, after removing dichloromethane under a reduced pressure, 200 mL of a 10% $NaHCO_3$ solution was added thereto and then, stirred at ambient temperature for 3 hours. Subsequently, a solid was filtered therefrom and added to 50 mL of a 10% NaOH and then, stirred at ambient temperature for 3 hours. Subsequently, a solid was filtered therefrom and then, washed with 500 mL of distilled water and separated through column chromatography, obtaining a compound represented by Chemical Formula 1a.

[Chemical Formula 1a]

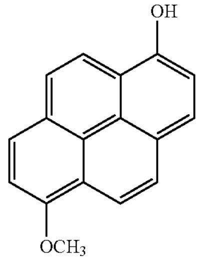

Synthesis Example 2a 3-perylenecarboxaldehyde (56.0 g, 0.2 mol) and bromic acid (38.7 g, 0.3 mol) were added to 300 mL of acetic acid and then, stirred at ambient temperature for 3 hours. When a reaction was completed, the resultant was slowly added in a dropwise fashion to 1 L of cold water, and a solid produced therein was filtered, obtaining a compound represented by Chemical Formula 2a.

[Chemical Formula 2a]

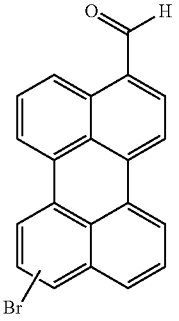

The compound represented by Chemical Formula 2a (35.9 g, 0.1 mol), copper iodide (0.57 g, 0.003 mol), and sodium methoxide (10.8 g, 0.2 mol) were added to 150 mL of dimethylformamide and then, stirred at 120° C. for 7 hours. When a reaction was completed, the resultant was slowly added in a dropwise fashion to 500 mL of cold water, and a solid produced therein was washed with 200 mL of a 10% $NH_4Cl$ aqueous solution, obtaining a compound represented by Chemical Formula 2b.

[Chemical Formula 2b]

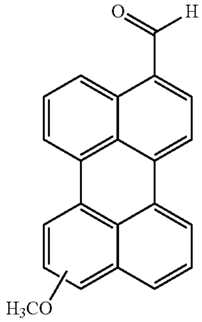

A compound represented by Chemical Formula 2c was prepared in the same manner as Synthesis Example 1a except that compound represented by Chemical Formula 2b (31.0 g, 0.1 mol) was used instead of 6-methoxy-1-pyrene carboxaldehyde (26.0 g, 0.1 mol).

[Chemical Formula 2c]

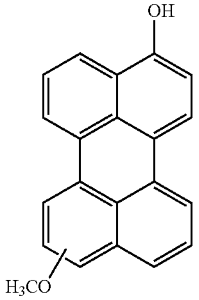

Synthesis Example 3a

In a flask, 1,8-dimethoxy pyrene (52.5 g, 0.2 mol) was dissolved in 500 mL of anhydrous dichloromethane and then, cooled to 0° C. under a nitrogen stream and stirred. Subsequently, boron tribromide (a 17% dichloromethane solution, 400 mL, 0.4 mol) was slowly added in a dropwise fashion to the flask by using a syringe over 1 hour and then, stirred at ambient temperature for 5 hours.

When a reaction was completed, the reactant was slowly added to a mixed solution of 1 L of water and 200 mL of dichloromethane at about 0° C. and then, vigorously stirred and allowed to stand. A lower layer was separated therefrom and washed with 500 mL of distilled water and then, after removing a solvent therefrom under a reduced pressure, separated through column chromatography, obtaining a compound represented by Chemical Formula 3a.

[Chemical Formula 3a]

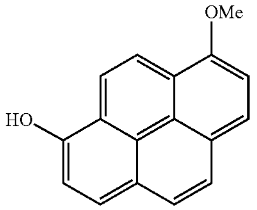

Synthesis Example 4a

In a flask, 1-pyrene carboxaldehyde (23.0 g, 0.1 mol) was dissolved in 500 mL of acetic acid and then, cooled to 0° C. under a nitrogen current and stirred. Subsequently, nitric acid (70%, 16 mL) was slowly added in a dropwise fashion to the flask over 1 hour with a syringe and then, stirred at ambient temperature for 20 hours.

When a reaction was completed, the reactant was slowly added to 1 L of water and then, vigorously stirred at 0° C. and allowed to stand. Then, precipitates therein were filtered and separated and then, respectively washed with 500 mL of an $NaHCO_3$ (sodium bicarbonate) saturated solution and 500 mL of distilled water and then, washed twice with 200 mL of methanol. A solvent remaining there was removed under a reduced pressure, obtaining a compound represented by Chemical Formula 4a.

[Chemical Formula 4a]

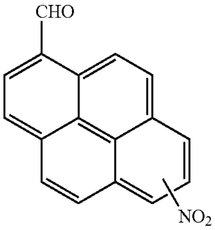

Synthesis of Polymer

Synthesis Example 1

The compound (11.7 g, 0.05 mol) represented by Chemical Formula 1a according to Synthesis Example 1a and 1-pyrene carboxaldehyde (11.5 g, 0.05 mol) were dissolved in 50 mL of dioxane, and p-toluene sulfonic acid monohydrate (0.19 g) was added thereto and then, stirred at 90° C. to 100° C. for 5 hours to 12 hours to perform a polymerization reaction.

A sample was taken from the polymerization reactant every 1 hour and then, measured with respect to a weight average molecular weight, and when the weight average molecular weight reached 1,800 to 2,500, the reaction was completed.

When the polymerization reaction was completed, the reactant was slowly allowed to cool to ambient temperature and added to 40 g of distilled water and 400 g of methanol and then, vigorously stirred and allowed to stand. After removing a supernatant therefrom, precipitates therein were dissolved in 80 g of cyclohexanone, and the solution was added to 320 g of methanol and then, vigorously stirred and allowed to stand. After removing a supernatant again, precipitates therein were treated by removing a solvent therefrom under a reduced pressure, preparing Polymer 1 including a structural unit represented by Chemical Formula 1-1.

[Chemical Formula 1-1]

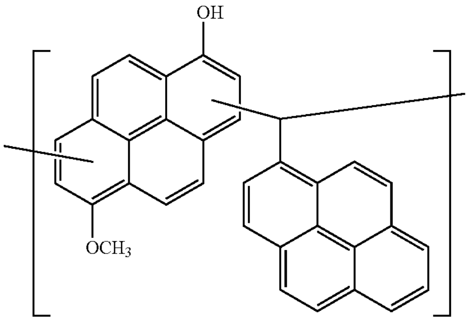

Synthesis Example 2

Polymer 2 including a structural unit represented by Chemical Formula 1-2 was prepared in the same manner as Synthesis Example 1 except that the compound represented by Chemical Formula 4a (13.8 g, 0.05 mol) was used instead of the 1-pyrene carboxaldehyde (11.5 g, 0.05 mol).

[Chemical Formula 1-2]

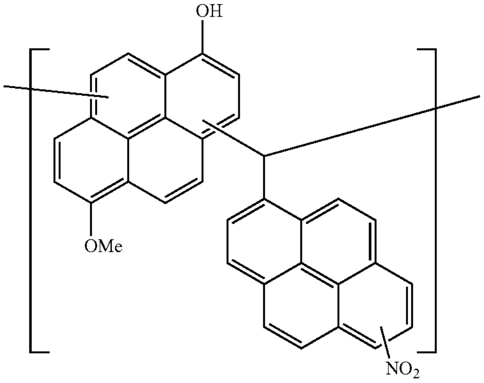

Synthesis Example 3

Polymer 3 including a structural unit represented by Chemical Formula 1-3 was prepared in the same manner as Synthesis Example 1 except that 6-hydroxy-1-pyrene carboxaldehyde (12.3 g, 0.05 mol) was used instead of the 1-pyrene carboxaldehyde (11.5 g, 0.05 mol).

[Chemical Formula 1-3]

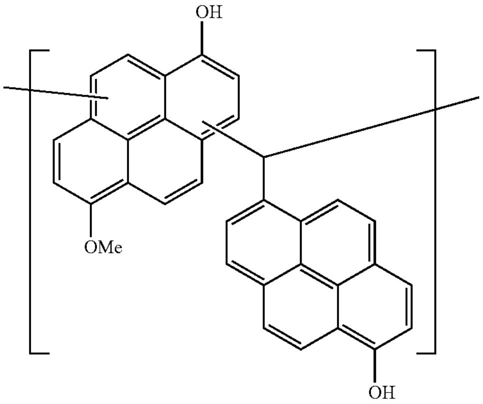

Synthesis Example 4

Polymer 4 including a structural unit represented by Chemical Formula 1-4 was prepared in the same manner as Synthesis Example 1 except that 1-acetylpyrene (12.2 g, 0.05 mol) was used instead of the 1-pyrene carboxaldehyde (11.5 g, 0.05 mol).

[Chemical Formula 1-4]

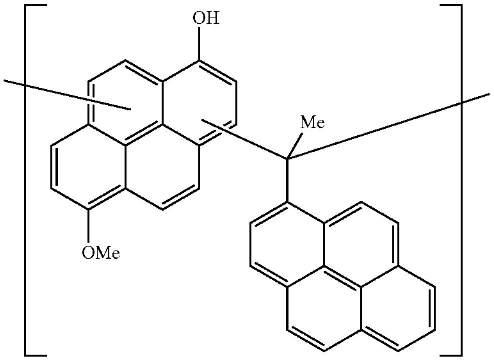

Synthesis Example 5

Polymer 5 including a structural unit represented by Chemical Formula 1-5 was prepared in the same manner as Synthesis Example 1 except that 1-hydroxy-8-methoxy pyrene (11.7 g, 0.05 mol) was used instead of the 1-hydroxy-6-methoxy pyrene (11.7 g, 0.05 mol).

[Chemical Formula 1-5]

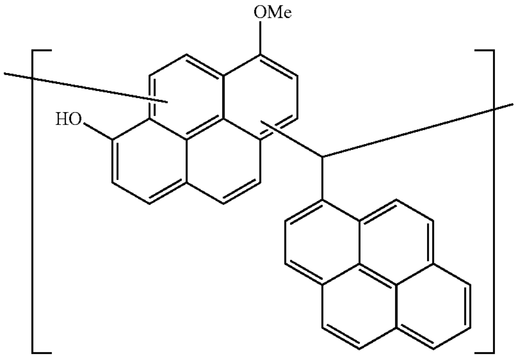

Comparative Synthesis Example 1

Comparative Polymer 1 including a structural unit represented by Chemical Formula A was prepared in the same manner as Synthesis Example 1 except that 1-hydroxypyrene (10.9 g, 0.05 mol) was used instead of the compound represented by Chemical Formula 1a (11.7 g, 0.05 mol).

[Chemical Formula A]

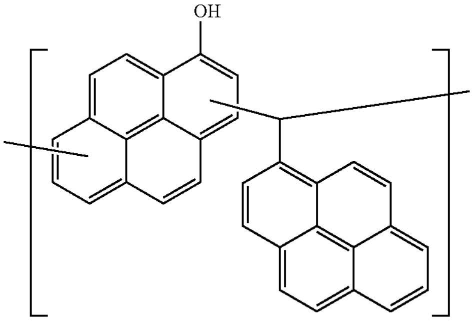

Comparative Synthesis Example 2

Comparative Polymer 2 including a structural unit represented by Chemical Formula B was prepared in the same manner as Synthesis Example 1 except that the compound (14.9 g, 0.05 mol) represented by Chemical Formula 2c according to Synthesis Example 2a was used instead of the compound represented by Chemical Formula 1a (11.7 g, 0.05 mol) according to Synthesis Example 1a.

[Chemical Formula B]

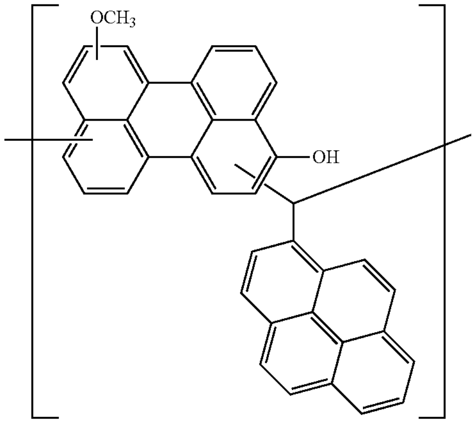

Comparative Synthesis Example 3

Comparative Polymer 3 including a structural unit represented by Chemical Formula D was prepared in the same manner as Synthesis Example 1 except that 1-naphthol (28.83 g, 0.2 mol), benzoperylene (41.4 g, 0.15 mol), and paraformaldehyde (6.0 g, 0.2 mol) were used instead of the compound represented by Chemical Formula 1a (11.7 g, 0.05 mol) according to Synthesis Example 1a and the 1-pyrene carboxaldehyde (11.5 g, 0.05 mol).

[Chemical Formula D]

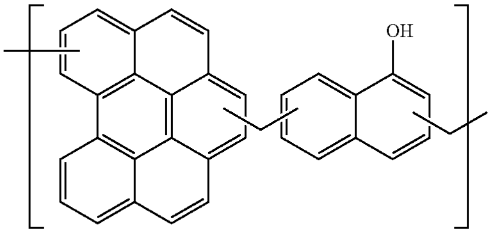

Comparative Synthesis Example 4

Comparative Polymer 4 including a structural unit represented by Chemical Formula 4 was prepared in the same manner as Synthesis Example 1 except that 1,8-dimethoxy pyrene (13.1 g, 0.05 mol) was used instead of the 1-hydroxy-6-methoxy pyrene (11.7 g, 0.05 mol).

[Chemical Formula E]

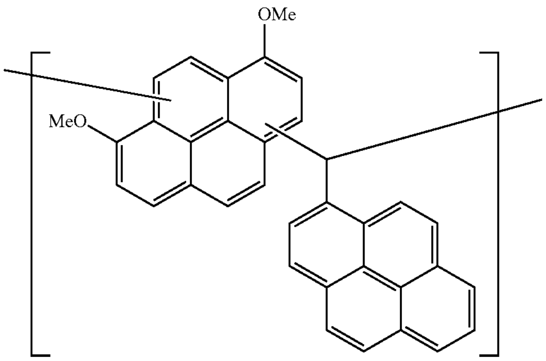

Evaluation 1: Evaluation of Etch Resistance

Each polymer according to Synthesis Examples 1 to 5 and Comparative Synthesis Example 1 to 4 was dissolved in PGMEA/ANONE mixed in a volume ratio of 7:3 at a solid concentration of 10 wt % to 20 wt %, preparing hardmask compositions according to Examples 1-1 to 5-1 and Comparative Examples 1-1 to 4-1.

The compositions according to Examples 1-1 to 5-1 and Comparative Examples 1-1 to 4-1 were respectively spin-coated on a silicon wafer and heat-treated at about 400° C. for 120 seconds, respectively forming about 4,000 Å-thick organic films.

The organic film was measured with respect to a thickness with a thin film thickness meter made by K-MAC and subsequently, dry-etched for 60 seconds and then, measured again with respect to a thickness.

A thickness difference of the organic film before and after the dry etching was used to calculate a bulk etch rate (BER) according to Calculation Equation 1.

Etch rate (Å/s)=(initial organic film thickness−organic film thickness after etching)/etch time [Calculation Equation 1]

The results are shown in Table 1.

TABLE 1

| | $N_2/O_2$ Bulk etch rate (Å/s) |
|---|---|
| Example 1-1 | 22.9 |
| Example 2-1 | 21.3 |
| Example 3-1 | 23.5 |
| Example 4-1 | 22.8 |
| Example 5-1 | 22.6 |
| Comparative Example 1-1 | 24.7 |
| Comparative Example 2-1 | 23.1 |
| Comparative Example 3-1 | 23.9 |
| Comparative Example 4-1 | 24.1 |

Referring to Table 1, the organic films formed of the hardmask compositions according to Examples 1-1 to 5-1 exhibited sufficient etch resistance against etching gas and thus improved and equivalent etch resistance against the etching gas, compared with the organic films formed of the hardmask compositions according to Comparative Examples 1-1 to 4-1.

Evaluation 2. Gap-Fill Characteristics and Planarization Characteristics

The FIG. 1*s* a reference diagram exemplarily showing a step difference of a hardmask layer in order to explain a method for evaluating planarization characteristics.

Each polymer according to Synthesis Examples 1 to 5 and Comparative Synthesis Examples 1 to 4 was dissolved in PGMEA/ANONE (7:3 by volume) at a solid concentration of 6 wt % to 10 wt %, preparing the hardmask compositions according to Examples 1-2 to 5-2 and Comparative Examples 1-2 to 4-2.

The hardmask compositions according to Examples 1-2 to 5-2 and Comparative Examples 1-2 to 4-2 were respectively coated on a silicon pattern wafer having an aspect ratio of 1:2 and another aspect ratio of 1:10 and then, heated on a hotplate at 400° C. for 2 minutes, respectively forming 2,000 Å-thick organic films.

Gap-fill characteristics were evaluated by examining a pattern cross-section to check generation of voids with a scanning electron microscope (SEM).

Planarization characteristics (step difference) were evaluated by measuring a thickness of each thin film at any three points where a pattern was not formed on the substrate by using a thin film thickness meter made by K-MAC in the FIGURE and then, obtaining an average thereof ($h_1$) and also, measuring a thickness of each thin film at any three points where the pattern was formed on the substrate and then, obtaining an average thereof ($h_2$) and then, calculating a step difference ($|h_1-h_2|$). As the step difference ($|h_1-h_2|$) was smaller, the planarization characteristics were more excellent.

The results are shown in Table 2.

TABLE 2

| | Gap-fill characteristics (presence or absence of Voids) | Planarization characteristics (step difference, Å) | |
|---|---|---|---|
| | | 1:2 aspect ratio | 1:10 aspect ratio |
| Example 1-2 | No voids | 52 | 120 |
| Example 2-2 | No voids | 70 | 145 |
| Example 3-2 | No voids | 38 | 92 |
| Example 4-2 | No voids | 83 | 159 |
| Example 5-2 | No voids | 49 | 125 |
| Comparative Example 1-2 | No voids | 96 | 321 |
| Comparative Example 2-2 | No voids | 87 | 195 |
| Comparative Example 3-2 | Voids were generated | 132 | 265 |
| Comparative Example 4-2 | No voids | 101 | 215 |

Referring to Table 2, the organic films formed of the hardmask compositions according to Examples 1-2 to 5-2 exhibited improved and equivalent gap-fill characteristics and planarization characteristics, compared with the organic films formed of the hardmask compositions according to Comparative Examples 1-2 to 4-2.

Evaluation 3. Film Density

The polymers according to Synthesis Examples 1 to 5 and Comparative Synthesis Examples 1 to 4 were respectively dissolved in PGMEA/ANONE (7:3 by volume) at a solid concentration of 3 to 5 wt %, preparing the hardmask compositions according to Examples 1-3 to 5-3 and Comparative Examples 1-3 to 4-3.

The hardmask compositions according to Examples 1-3 to 5-3 and Comparative Examples 1-3 to 4-3 were respectively coated on a silicon pattern wafer and heat-treated on a hot plate at 400° C. for 2 minutes, respectively forming 800 Å-thick organic films.

The organic films were measured with respect to film density by using an X-ray reflectometer.

The results are shown in Table 3.

TABLE 3

| | Film density (g/cm$^3$) |
|---|---|
| Example 1-3 | 1.35 |
| Example 2-3 | 1.38 |
| Example 3-3 | 1.42 |
| Example 4-3 | 1.32 |
| Example 5-3 | 1.44 |
| Comparative Example 1-3 | 1.28 |
| Comparative Example 2-3 | 1.37 |
| Comparative Example 3-3 | 1.25 |
| Comparative Example 4-3 | 1.29 |

Referring to Table 3, the organic films formed of the hardmask compositions according to Examples 1-3 to 5-3 exhibited improved and equivalent film density compared with the organic films formed of the hardmask compositions according to Comparative Examples 1-3 to 4-3.

By way of summation and review, according to small-sizing the pattern to be formed, it may be difficult to provide a fine pattern having an excellent profile by using some lithographic techniques. Accordingly, an auxiliary layer, called a hardmask layer, may be formed between the material layer and the photoresist layer to provide a fine pattern.

One or more embodiments may provide a hardmask composition that may be effectively applied to a hardmask layer.

Etch resistance, planarization characteristics, gap-fill characteristics, and film density of the hardmask layer may be simultaneously secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:

a polymer; and a solvent, wherein:

the polymer includes at least one structural unit represented by Chemical Formulae 1-1 to 1-5:

[Chemical Formula 1-1]

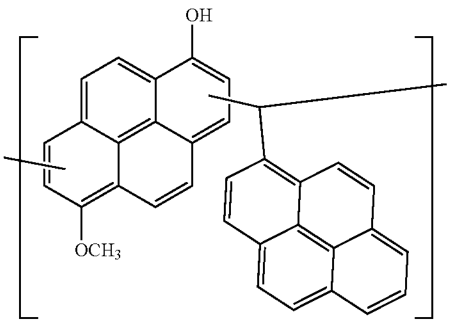

-continued

[Chemical Formula 1-2]

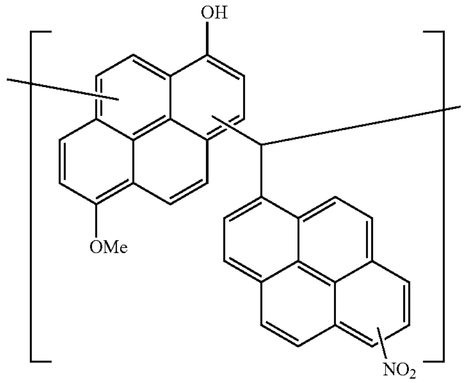

[Chemical Formula 1-3]

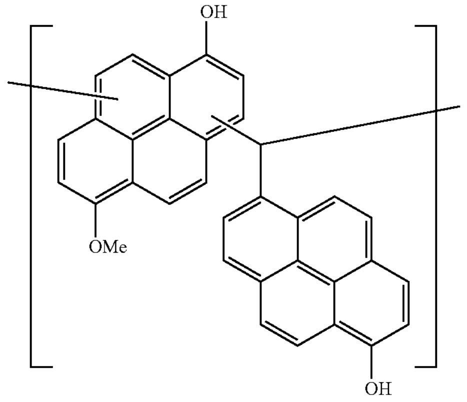

[Chemical Formula 1-4]

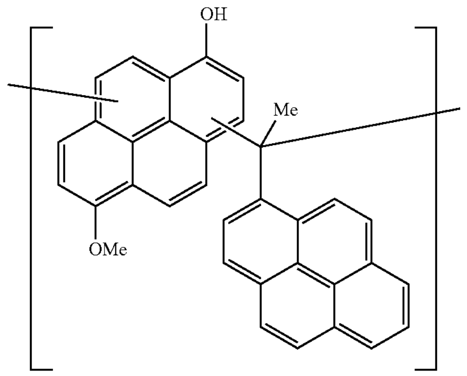

[Chemical Formula 1-5]

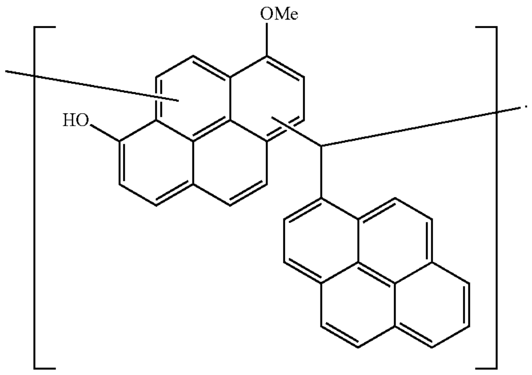

2. The hardmask composition as claimed in claim 1, wherein the structural unit represented by Chemical Formulae 1-1 to 1-5 is derived from a reaction mixture including:

a hydroxy methoxy pyrene compound selected from Group 2, and a pyrene carbonyl compound selected from the group consisting of pyrene-1-carboxaldehyde, 6-hydroxypyrene-1-carboxaldehyde, nitropyrene-1-carboxaldehyde, acetylpyrene, and a combination thereof.

[Group 2]

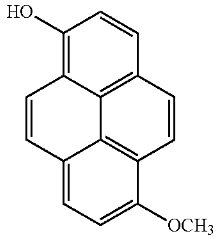

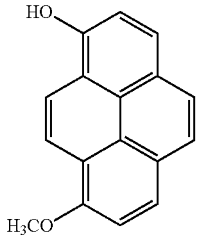

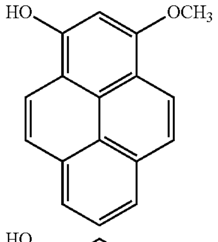

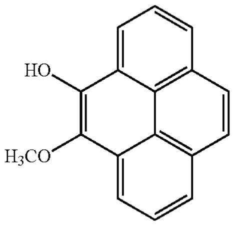

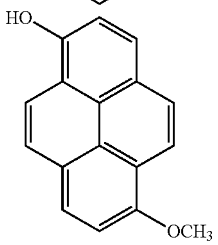

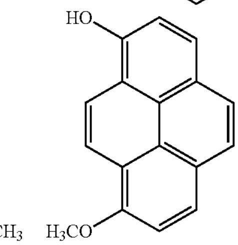

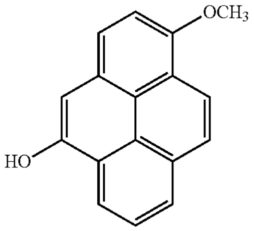

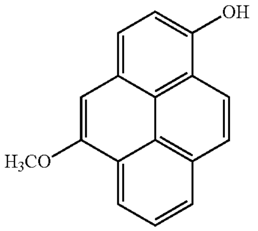

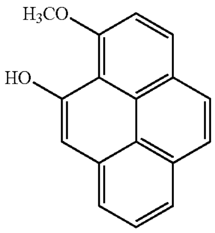

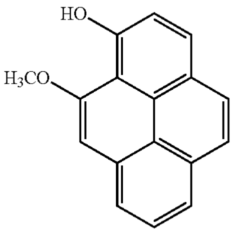

-continued

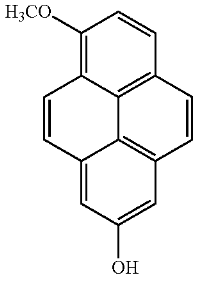

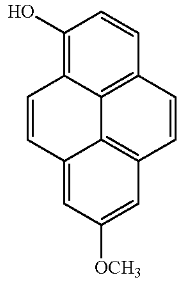

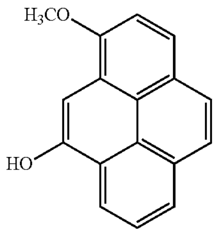

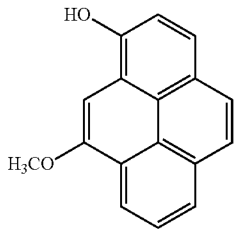

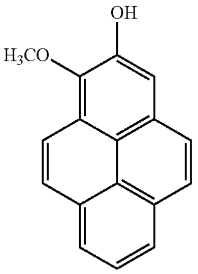

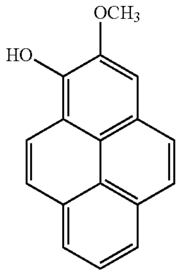.

3. A hardmask layer comprising a cured product of the hardmask composition as claimed in claim 1.

4. The hardmask layer as claimed in claim 3, wherein the cured product includes a condensed polycyclic aromatic hydrocarbon.

5. A method of forming patterns, the method comprising:

applying the hardmask composition as claimed in claim 1 on a material layer and heat-treating the resultant to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed part of the material layer.

* * * * *